United States Patent
Ando et al.

(10) Patent No.: US 8,592,264 B2
(45) Date of Patent: Nov. 26, 2013

(54) SOURCE-DRAIN EXTENSION FORMATION IN REPLACEMENT METAL GATE TRANSISTOR DEVICE

(75) Inventors: Takashi Ando, Tuckahoe, NY (US); Huiming Bu, Millwood, NY (US); Ramachandra Divakaruni, Ossining, NY (US); Bruce B. Doris, Brewster, NY (US); Chung-Hsun Lin, White Plains, NY (US); Huiling Shang, Yorktown Heights, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/332,991

(22) Filed: Dec. 21, 2011

(65) Prior Publication Data

US 2013/0161763 A1 Jun. 27, 2013

(51) Int. Cl.
*H01L 29/78* (2006.01)
*H01L 21/336* (2006.01)

(52) U.S. Cl.
USPC ............ 438/163; 257/408; 257/E21.437; 257/E29.266; 438/183; 438/184; 438/300

(58) Field of Classification Search
CPC .......... H01L 29/66545; H01L 29/66537; H01L 29/0615; H01L 29/7833; H01L 29/66575; H01L 29/6659; H01L 21/02098; H01L 21/823412; H01L 21/823807
USPC .......... 257/349; 438/174, 194, 217, 163, 183, 438/184
See application file for complete search history.

(56) References Cited

U.S. PATENT DOCUMENTS

| | | | |
|---|---|---|---|
| 5,413,949 A * | 5/1995 | Hong | 438/290 |
| 5,856,225 A | 1/1999 | Lee et al. | |
| 5,888,873 A * | 3/1999 | Krivokapic | 438/307 |
| 5,981,346 A * | 11/1999 | Hopper | 438/304 |
| 6,245,618 B1 * | 6/2001 | An et al. | 438/289 |
| 6,300,201 B1 * | 10/2001 | Shao et al. | 438/281 |
| 6,580,149 B2 * | 6/2003 | Tran et al. | 257/549 |

(Continued)

OTHER PUBLICATIONS

C. Ortolland et al., "Laser-Annealed Junctions with Advanced CMOS Gate Stacks for 32nm Node: Perspectives on Device Performance and Manufacturability", Jun. 17-19, 2008, 2008 Symposium on VLSI Technology, pp. 186-187.*

(Continued)

*Primary Examiner* — Kevin Parendo
*Assistant Examiner* — Pauline Vu
(74) *Attorney, Agent, or Firm* — Harrington & Smith

(57) ABSTRACT

A method includes forming on a surface of a semiconductor a dummy gate structure comprised of a plug; forming a first spacer surrounding the plug, the first spacer being a sacrificial spacer; and performing an angled ion implant so as to implant a dopant species into the surface of the semiconductor adjacent to an outer sidewall of the first spacer to form a source extension region and a drain extension region, where the implanted dopant species extends under the outer sidewall of the first spacer by an amount that is a function of the angle of the ion implant. The method further includes performing a laser anneal to activate the source extension and the drain extension implant. The method further includes forming a second spacer surrounding the first spacer, removing the first spacer and the plug to form an opening, and depositing a gate stack in the opening.

11 Claims, 8 Drawing Sheets

(56) References Cited

U.S. PATENT DOCUMENTS

| | | | |
|---|---|---|---|
| 6,667,206 B2 * | 12/2003 | Sayama | 438/231 |
| 6,743,687 B1 | 6/2004 | Yu | |
| 7,064,399 B2 * | 6/2006 | Babcock et al. | 257/408 |
| 7,091,092 B2 * | 8/2006 | Sneelal et al. | 438/268 |
| 7,429,769 B2 | 9/2008 | Diaz et al. | |
| 7,456,068 B2 | 11/2008 | Kavalieros et al. | |
| 7,772,071 B2 | 8/2010 | Chong et al. | |
| 2002/0142529 A1 * | 10/2002 | Matsuda et al. | 438/175 |
| 2003/0022422 A1 * | 1/2003 | Torii et al. | 438/183 |
| 2003/0119323 A1 * | 6/2003 | Park | 438/692 |
| 2005/0090066 A1 * | 4/2005 | Zhu et al. | 438/300 |
| 2005/0130432 A1 * | 6/2005 | Machala | 438/694 |
| 2005/0130434 A1 * | 6/2005 | Chien et al. | 438/706 |
| 2006/0008973 A1 | 1/2006 | Phua et al. | |
| 2006/0084247 A1 * | 4/2006 | Liu | 438/510 |
| 2006/0157797 A1 | 7/2006 | Tateshita | |
| 2007/0166922 A1 | 7/2007 | Surdeanu et al. | |
| 2007/0287259 A1 * | 12/2007 | Kavalieros et al. | 438/301 |
| 2007/0298557 A1 * | 12/2007 | Nieh et al. | 438/197 |
| 2008/0119023 A1 * | 5/2008 | Lin et al. | 438/279 |
| 2008/0237663 A1 | 10/2008 | Hanafi | |
| 2009/0127632 A1 | 5/2009 | Pas | |
| 2011/0079861 A1 * | 4/2011 | Shifren et al. | 257/402 |
| 2011/0248351 A1 * | 10/2011 | Chiang et al. | 257/369 |
| 2011/0316093 A1 * | 12/2011 | Yang et al. | 257/408 |
| 2012/0104470 A1 | 5/2012 | Ponoth | |

OTHER PUBLICATIONS

Chatterjee et al., "Sub-100nm Gate Length Metal Gate NMOS Transistors Fabricated by a Replacement Gate Process", International Electron Devices Meeting, 1997, Technical Diges, Dec. 7-10, 1997, pp. 821-824.

C-W Oh et al., "Highly Manufacturable Sub-50 nm High Performance CMOSFET Using Real Damascene Gate Process", Symposium on VLSI Technology, 2003, Digest of Technical papers, Jun. 10-12, 2003, pp. 147-148.

Matsuda et al., "Performance Improvement of Metal Gate CMOS Technologies", 2001 Symposium on VLSI Technology, Digest of Technical Papers, pp. 63-64.

Uejima et al., "Novel Diffusion-less Ultra-Shallow Junction Engineering Based on Millisecond Annealing for Sub-30 nm Gate Length Planar Bulk CMOSFET, Extended Abstracts-2008 8th International Workshop on Junction Technology", May 15-16, 2008.

Narihiro et al., "Sub-30nm MOSFET Fabrication Technology Incorporating Precise Dopant Profile Design Using Diffusion-Less High-Activation Laser Annealing", 14th IEEE International Conference on Advanced Thermal Processing of Semiconductors, 2006 (RTP 2006), pp. 147-151.

Ortolland et al., "Laser-Annealed Junctions with Advanced CMOS Gate Stacks for 32nm Node: Perspectives on Device Performance and Manufacturability", 2008 Symposium on VLSI Technology Digest of Technical Papers, pp. 186-187.

Kikuchi et al., "A Promising Planar Transistor with In-Situ Doped Selective Si Epitaxy Technology (GORES MOSFET) for 32 nm Node and Beyond", 2006 IEEE, pp. 1-2.

Orlowski et al., "CMOS Challenges of Keeping up with Moore's Law", 13th International Conference on Advanced Thermal Processing of Semiconductors—RTP, Oct. 4-7, 2005.

Cheng et al., "Extremely Thin SOI (ETSOI) Technology: Past, Present, and Future", 2010 IEEE International SOI Conference (SOI), Oct. 11-14, 2010. 4 pages.

Combined Search and Examination Report under Sections 17 and 18(3) for corresponding GB Patent Applicatson No. 1222136.2 mailed Mar. 20, 2013.

* cited by examiner

SOURCE-DRAIN EXTENSION FORMATION IN REPLACEMENT METAL GATE TRANSISTOR DEVICE

TECHNICAL FIELD

The exemplary embodiments of this invention relate generally to transistor devices and, more specifically, relate to field effect transistor (FET) type devices having a source, a drain and a gate structure formed using a replacement gate process, as well as to methods to fabricate such devices.

BACKGROUND

A FET can be fabricated on a bulk semiconductor substrate (planar devices) or on a silicon-on-insulator (SOI) type of structure, including extremely thin SOI (ETSOI) structures. In a replacement gate process a so-called dummy gate structure is formed from, for example, polysilicon (poly), source-drain (S/D) processing is initiated or continued and the dummy gate structure is removed and replaced by an electrically conductive metal-containing gate stack that overlies a channel region between the S/D in the bulk semiconductor substrate or in the silicon layer of the SOI structure.

One problem that can arise during the fabrication of replacement gate FET devices relates to the formation of S/D extension regions relative to the FET channel and the proper alignment and overlap of the S/D extensions.

SUMMARY

In a first aspect the exemplary embodiments of this invention provide a method to fabricate a field effect transistor. The method includes forming on a surface of a semiconductor a dummy gate structure comprised of a plug; forming a first spacer surrounding the plug, the first spacer being a sacrificial spacer; and performing an angled ion implant so as to implant a dopant species into the surface of the semiconductor adjacent to an outer sidewall of the first spacer to form a source extension region and a drain extension region, where the implanted dopant species extends under the outer sidewall of the first spacer by an amount that is a function of the angle of the ion implant. The method further includes performing a laser anneal to activate the source extension and the drain extension implant.

In another aspect the exemplary embodiments of this invention provide a transistor structure that comprises a gate stack disposed on a surface of a semiconductor body, the gate stack comprised of a layer of gate dielectric surrounding gate metal and overlying a channel region in the semiconductor body; a source having a source extension region and a drain having a drain extension region formed in the semiconductor body, each extension region having a sharp, abrupt junction that overlaps an edge of the gate stack; a punch through stopper region comprised of an implanted dopant species beneath the channel in the semiconductor body between the source and the drain; and a shallow channel region comprised of an implanted dopant species located between the punch through stopper region and the channel.

In yet another aspect the exemplary embodiments of this invention provide a transistor structure that comprises a dummy gate plug disposed on a surface of a semiconductor body; a first spacer layer having an inner surface disposed on and surrounding the dummy gate plug; a second spacer layer disposed on and surrounding an outer surface of the first spacer layer, the second spacer layer having a greater thickness than the first spacer layer; and a source extension region and a drain extension region formed in the semiconductor body, where each extension region has a sharp, abrupt junction that overlaps an edge of the outer surface of the first spacer layer.

BRIEF DESCRIPTION OF THE SEVERAL VIEWS OF THE DRAWINGS

FIG. 1A shows a cross-sectional enlarged view of a portion of wafer comprised of a Si substrate having shallow trench isolation regions that define an active area and, in the active area, a dummy gate plug within a first, sacrificial, spacer;

FIG. 1B shows the structure of FIG. 1A during a tilted angle extension/halo implant followed by a laser anneal to form extension/halo regions;

FIG. 1C shows the structure after the angled implant and laser anneal of FIG. 1B, and after formation of a second spacer that covers the first sacrificial spacer;

FIG. 1D shows the structure of FIG. 1C during a S/D implant;

FIG. 1E shows the structure of FIG. 1D after the S/D are silicided;

FIG. 1F shows the structure of FIG. 1E after deposition of an inter-layer dielectric;

FIG. 1G shows the structure of FIG. 1F after a CMP operation and a deep punch through stopper (PTS) implant;

FIG. 1H shows the structure of FIG. 1G after the dummy gate plug is removed and a shallow channel ion implant is performed;

FIG. 1I shows the structure of FIG. 1H after the sacrificial spacer is removed; and FIG. 1J shows the structure of FIG. 1I after gate stack is fabrication within an opening left by the removal of the dummy gate plug and sacrificial spacer.

FIG. 2A shows a cross-sectional enlarged view of a portion of an ETSOI wafer having shallow trench isolation regions that define an active area in the ETSOI and, in the active area, a dummy gate plug within a first, sacrificial, spacer and the performance of a tilted angle extension implant followed by a laser anneal to form extension regions;

FIG. 2B shows the structure after the angled implant and laser anneal of FIG. 2A, and after the formation of the second spacer that covers the first spacer;

FIG. 2C shows the structure of FIG. 2B after processing to form raised source/drain (RSD) structures;

FIG. 2D shows the structure of FIG. 2C after deposition of an inter-layer dielectric;

FIG. 2E shows the structure of FIG. 2D after a CMP operation followed by removal of the dummy gate plug and the sacrificial first spacer; and FIG. 2F shows the structure of FIG. 2E after gate stack is fabrication within an opening left by the removal of the dummy gate plug and sacrificial first spacer.

DETAILED DESCRIPTION

Achieving a high dopant concentration and a steep profile extension is challenging with both planar and ETSOI devices. The embodiments of this invention provide a self-aligned extension formation process to achieve desired extension requirements with replacement metal gate processes for both planar and ETSOI structures. The exemplary embodiments of this invention achieve this through the use of at least a sacrificial dummy gate spacer, a tilted angle extension implant and a laser-only anneal for extension activation. The dummy gate spacer (e.g., a SiO$_2$ spacer) can be removed after dummy gate poly removal to cause the metal gate to be closely adjacent to an extension diffusion region. In addition, for the planar embodiment a punch through stopper (PTS) implant is performed after a chemical mechanical polish (CMP) operation and prior to removal of the dummy gate poly. The embodiments serve to minimize direct overlap (Ldo) for achieving gate length (Lg) scaling.

The planar embodiment will be described first with respect to FIGS. 1A-1J, collectively referred to as FIG. 1, followed by the ETSOI embodiment with respect to FIGS. 2A-2F, collectively referred to as FIG. 2. In FIGS. 1 and 2 the various layer thicknesses and other feature dimensions are not drawn to scale. It is pointed out that the fully depleted (FD) ETSOI embodiment of FIG. 2 is applicable as well to a partially depleted (PD) SOI embodiment having a relatively thicker buried oxide (BOX) and overlying silicon layer.

Figure 1A:
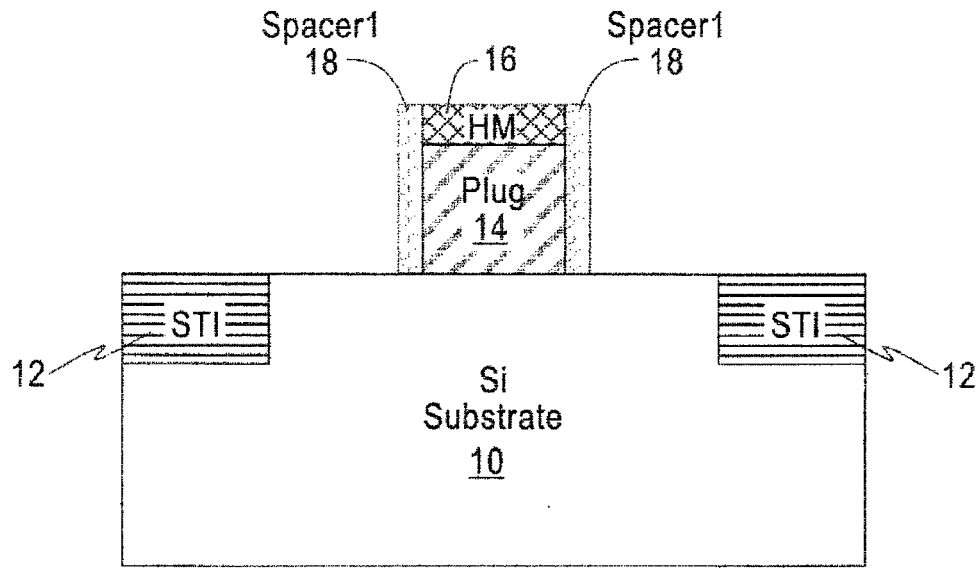
FIGS. 1A-1J, collectively referred to as FIG. 1, describe an embodiment of planar device processing on a bulk semiconductor substrate, where.

FIG. 1A shows a cross-sectional enlarged view of a portion of wafer comprised of a substrate, e.g., a Si substrate 10. Two shallow trench isolation (STI) regions 12 are shown that define an active area between the STI regions in which a FET will be fabricated using a replacement gate process. In the active area is formed a structure having a dummy poly "plug" 14 having an overlying hardmask (HM), such as a SiN HM 16. The plug 14 has approximate dimensions that are desired for the final metal gate stack that will be formed in FIG. 1J. Surrounding the plug 14 and HM 16 in accordance with an aspect of this invention is a first spacer (Spacer1) 18. The Spacer1 18 can be SiO$_2$ and can have a thickness in a range of about 1 nm to about 5 nm, with about 2 nm being one preferred value. As will become apparent below the plug 14, the HM 16 and the Spacer1 18 are all subsequently removed at various stages of the fabrication process.

Figure 1B:
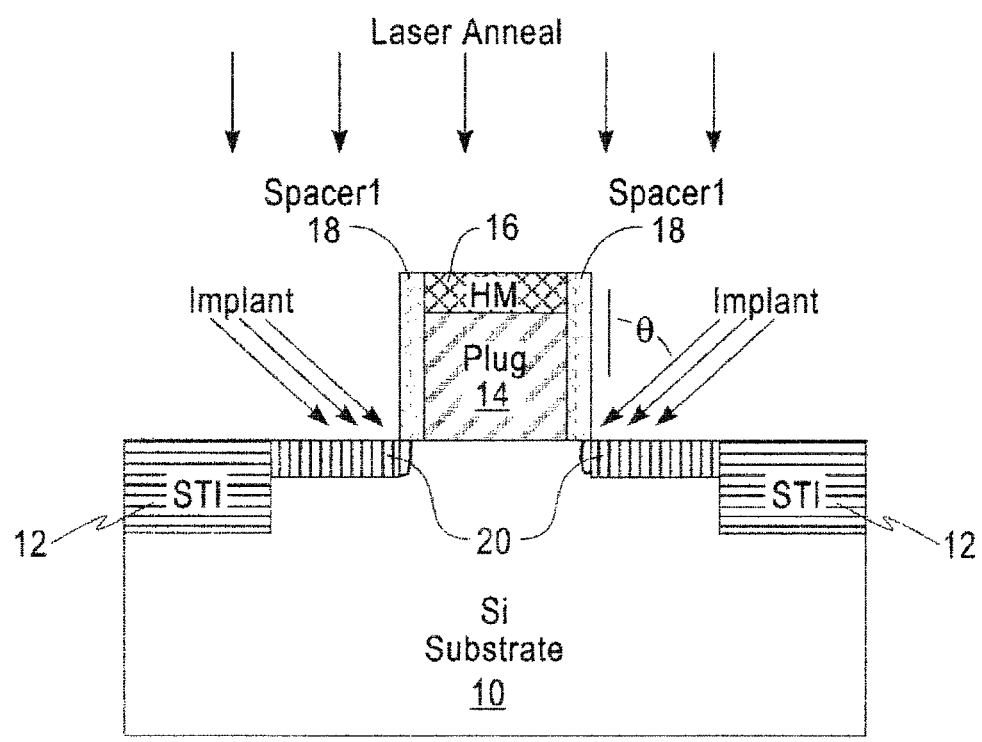

FIG. 1B shows the structure of FIG. 1A during a tilted angle extension/halo implant followed by a laser anneal to form extension/halo regions 20 on each side of the dummy gate structure. The Spacer1 18 beneficially serves as an implant mask so that there is but a slight overlap of the extension/halo region 20 beneath the outer vertical sidewall of the Spacer1 18. The implant-halo/extension regions 20 are relatively shallow (e.g., about 2 nm in depth from the surface of the Si substrate).

When the transistor being fabricated is an NFET the following conditions can apply:
Halo: implant species Boron (B), about 5 to about 10 KeV implant energy, about $7e^{12}$ to $7e^{13}$ (atom/cm$^2$) with about 10 degree to about 30 degree implant tilt angle θ;
Extension: implant species Arsenic (As), about 1 to about 3 KeV implant energy, about 1 to about $2e^{15}$ (atom/cm$^2$) with about 7 degree to about 15 degree implant angle θ.

When the transistor being fabricated is a PFET the following conditions can apply:
Halo: implant species Phosphorus (P), about 15 to about 30 KeV implant energy, about $7e^{12}$ to about $2e^{13}$ (atom/cm$^2$), about 0 degree to about 30 degree implant tilt angle θ;
Extension: implant species BF$_2$, about 1 to about 3 KeV implant energy, about 1 to about $2e^{15}$ (atom/cm$^2$), about 0 degree to about 15 degree implant angle θ.
Extension: implant species BF$_2$, about 1 to about 3 KeV implant energy, about 1 to about $2e^{15}$ (atom/cm$^2$), about 0 degree to about 15 degree implant angle θ.

That is, and as non-limiting examples, the extension implant can be performed at an angle of about 10 degrees measured from a surface normal, and the halo implant can be performed at an angle of about 30 degrees measured from the surface normal.

The laser (only) anneal can use a temperature of about 1300° C. for a period of several milliseconds. The laser anneal beneficially forms a sharp, well defined extension/halo junction beneath the outer vertical sidewall of the Spacer1 18 with minimal diffusion of the implanted dopant species.

Figure 1C:
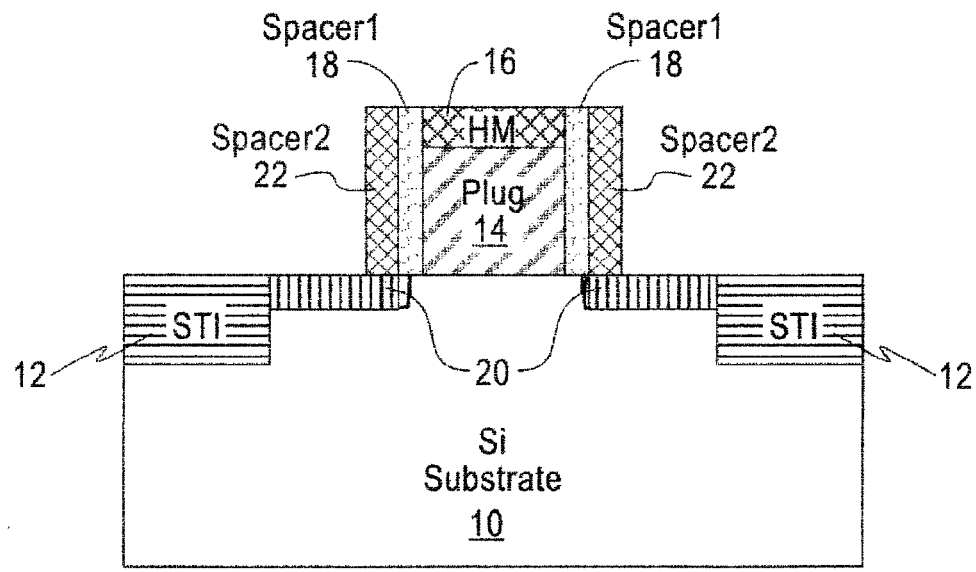

FIG. 1C shows the structure after the angled implant and laser anneal of FIG. 1B, and after the formation of a second spacer (Spacer2 22) that covers SiO$_2$ Spacer1 18. Spacer2 22 can be a Si$_3$N$_4$ spacer and can have a thickness of, for example, about 8 nm Note that Spacer2 22 will be retained in the final FET device.

Figure 1D:
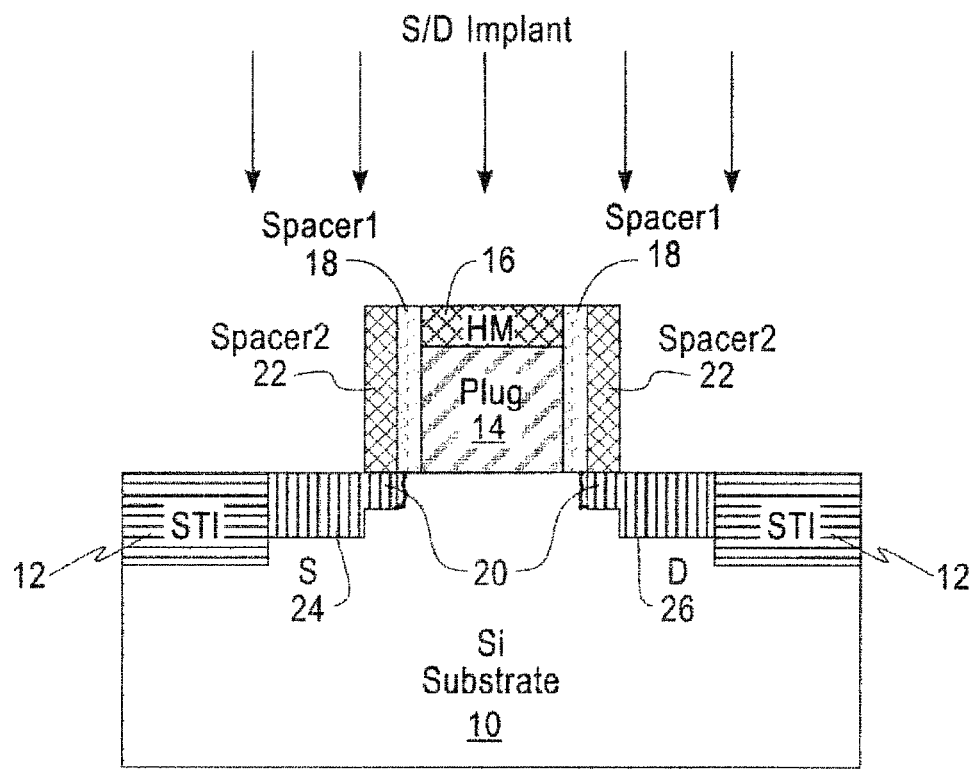

FIG. 1D shows the structure of FIG. 1C during a S/D implant to form a source (S) region 24 and a drain (D) region 26 adjacent to the edges of the Spacer2 22. The source (S) region 24 and a drain (D) region 26 extend deeper into the Si substrate 10 than the extension implant regions 20. The S/D regions 24, 26 can be doped using the same dopant species as the extensions 20, but are doped to a higher concentration (e.g., about $1e^{20}$). The S/D implant is followed by low temperature rapid thermal anneal (RTA), e.g., a spike (several milliseconds) 1000° C. anneal, to drive in the implanted dopant for overlap defect correction, followed by a second laser anneal (e.g., 1300° C. for several milliseconds) to activate the implanted S/D dopant. The second laser anneal operation serves to provide a sharp S/D junction by limiting diffusion of the dopant species. A goal is to form a sharp, abrupt junction where the extension 20 slightly overlaps the gate stack to be subsequently formed.

Figure 1E:
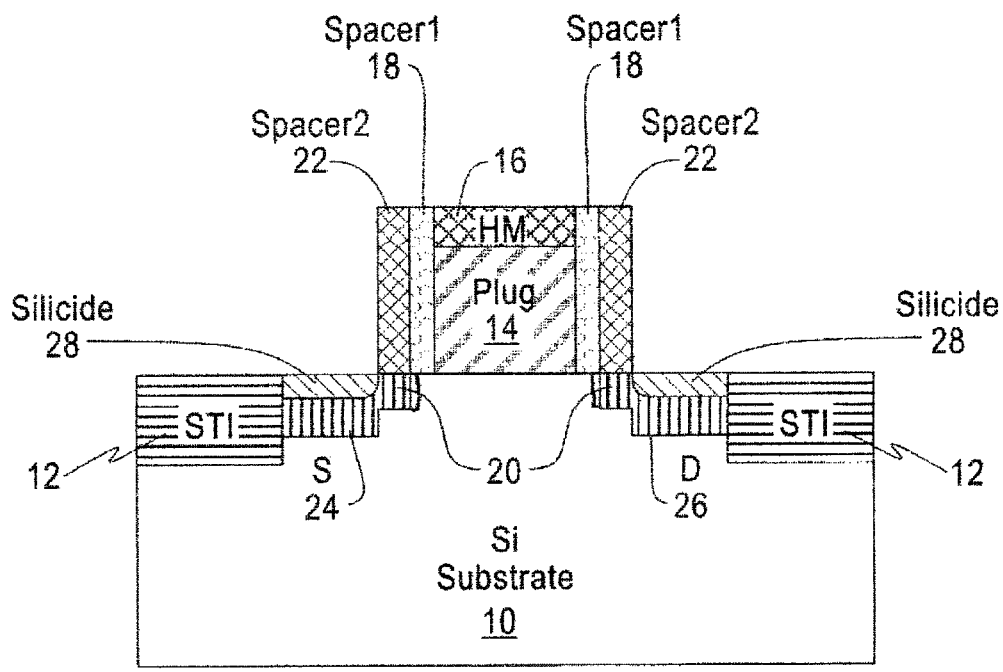

FIG. 1E shows the structure of FIG. 1D after the source 24 and drain 26 are silicided. For example, Nickel (Ni) can be deposited and heated to form Nickel silicide regions 28 by a conventional process. The silicided regions 28 can extend into the S/D regions 24, 26 to a depth of, for example, about 8 nm.

Figure 1F:
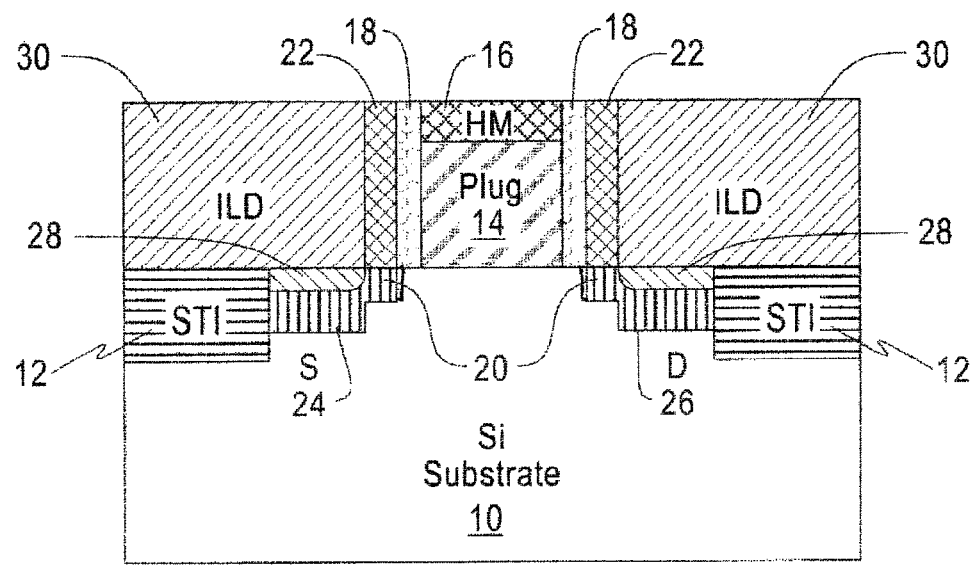

FIG. 1F shows the structure of FIG. 1E after deposition of an inter-layer dielectric (ILD) 30. The ILD 30 can be, for example, SiO$_2$.

Figure 1G:
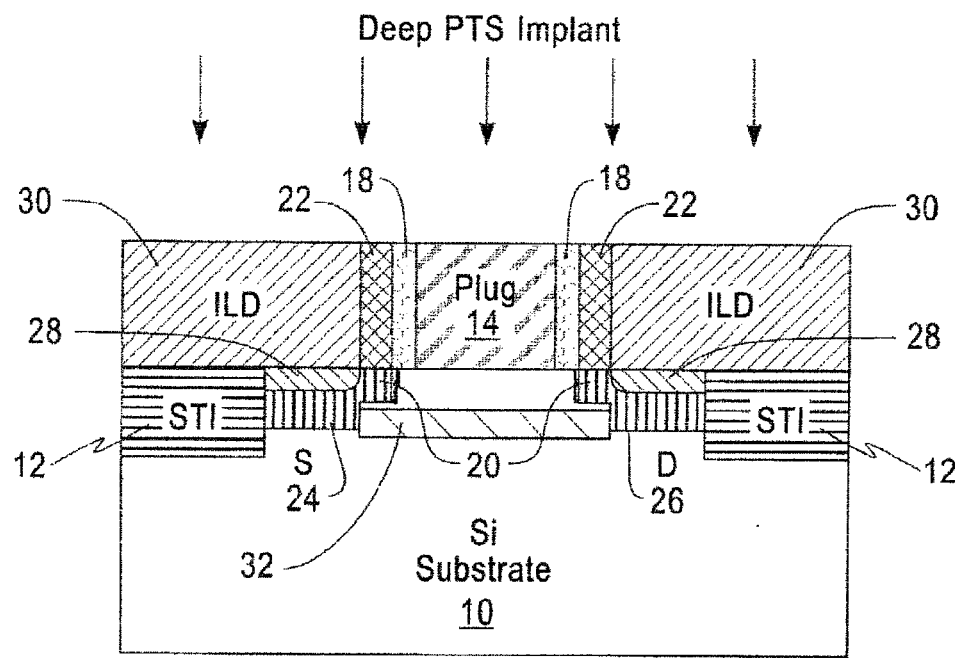

FIG. 1G shows the structure of FIG. 1F after a CMP operation that removes material, including HM 16, down to the top of the plug 14. This is followed by a deep punch through stopper (PTS) implant to form an implanted PTS region 32 beneath the channel.

As is known, the drain current of a MOS transistor will increase in some cases in which a parasitic current path exists between drain and source. This "punch through" component of the drain current is poorly controlled by the gate contact since the current path is located deeper in the bulk, farther away from the gate. This current adds to the sub-threshold leakage current and can result in increased power consumption. One technique to reduce the punch through effect is to increase the overall bulk doping level. As a result the drain and source depletion regions will become smaller and will not establish the parasitic current path.

When the transistor being fabricated is an NFET the following conditions can apply:
Deep PTS: implant species Boron (B), about 5 to about 15 KeV implant energy, about $7e^{12}$ to about $2e^{13}$ (atom/cm$^2$), 0 degree implant angle (no tilt).

The following alternative deep PTS conditions can also apply for the NFET case:
Implant species Carbon(C), about 3 to about 7 KeV implant energy, about $1e^{14}$ to about $1e^{15}$ (atom/cm$^2$), 0 degree implant angle (no tilt).

When the transistor being fabricated is a PFET the following conditions can apply:

Deep PTS: implant species Phosphorus (P), about 15 to about 30 KeV implant energy, about $7e^{12}$ to about $2e^{13}$ (atom/cm$^2$), 0 degree implant angle (no tilt).

Figure 1H:
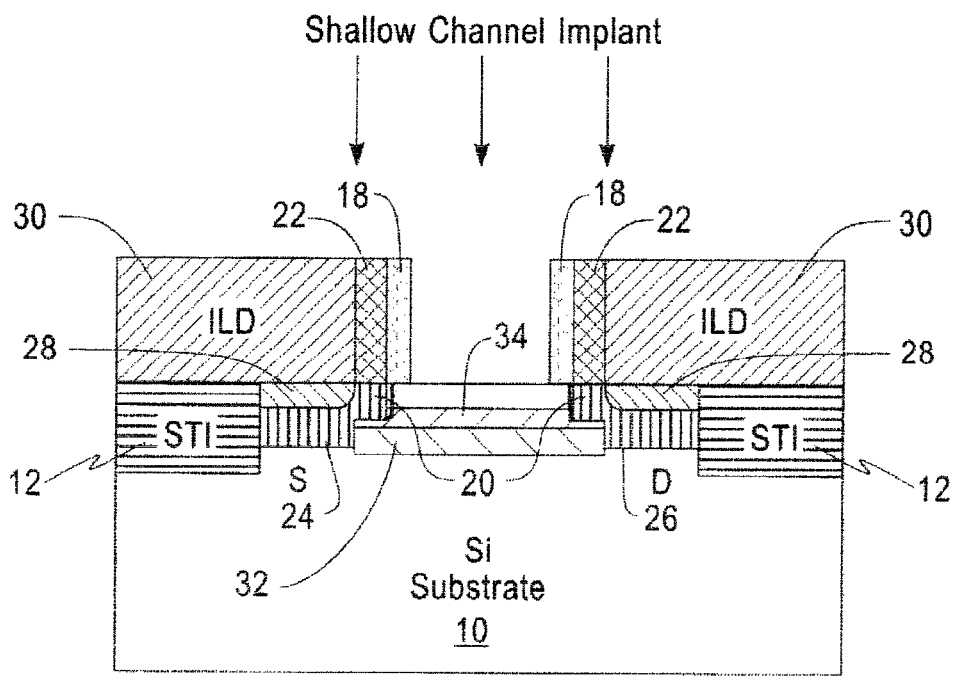

FIG. 1H shows the structure of FIG. 1G after the poly plug 14 is removed and a shallow channel ion implant is performed to form a second implanted region 34 beneath the channel and above (closer to the channel) the implanted PTS region 32. Any suitable etching process can be used to remove the poly plug 14, such as a wet TetraMethyl Ammonium Hydroxide (TMAH) chemical etching process.

When the transistor being fabricated is an NFET the following conditions can apply:

Shallow channel: implant species Boron (B), about 5 to about 15 KeV implant energy, about $7e^{12}$ to about $2e^{13}$ (atom/cm$^2$), 0 degree implant angle (no tilt).

The following alternative shallow implant conditions can also apply for the NFET case:

Implant species Carbon(C), about 3 to about 7 KeV implant energy, about $1e^{14}$ to about $1e^{15}$ (atom/cm$^2$), 0 degree implant angle (no tilt).

When the transistor being fabricated is a PFET the following conditions can apply:

Shallow channel: implant species Phosphorus (P), about 15 to about 30 KeV implant energy, about $7e^{12}$ to about $2e^{13}$ (atom/cm$^2$), 0 degree implant angle (no tilt).

The PTS and shallow channel (well) implants can be subsequently activated by a thermal process used, for example, to grow a low temperature oxide.

Figure 1I:
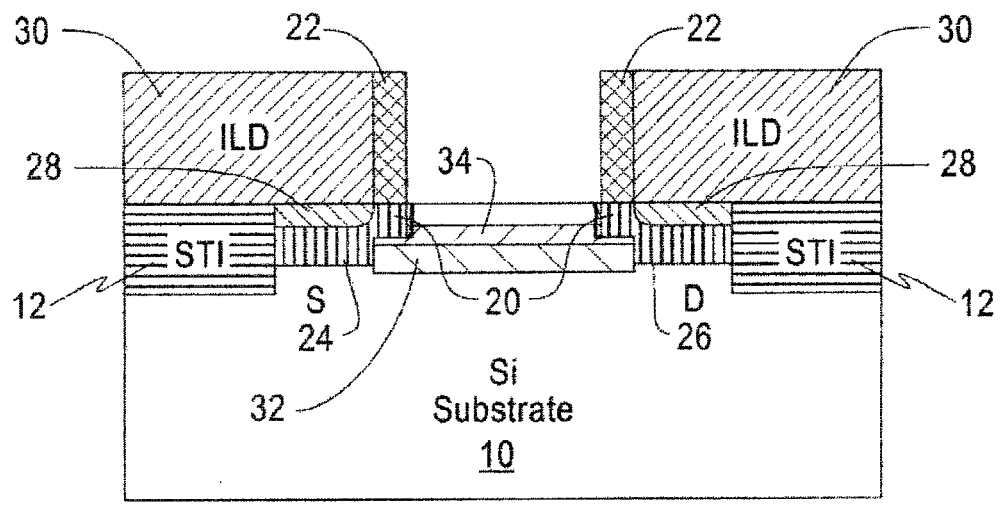

FIG. 1I shows the structure of FIG. 1H after the sacrificial thin spacer SiO$_2$ 18 is removed leaving the Si$_3$N$_4$ spacer 22 in place. This can be achieved using any suitable etching process. Removal of the thin spacer 18 results in establishing an optimum extension/halo 20 overlap with the gate region due to the angled implant performed in FIG. 1B.

Figure 1J:
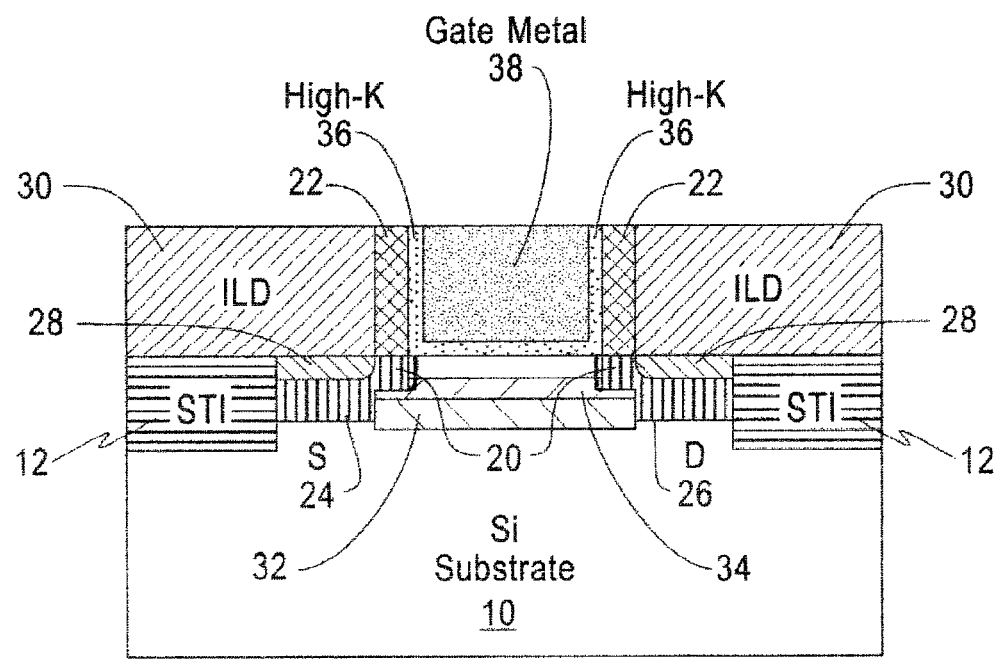

FIG. 1J shows the structure of FIG. 1I after the gate stack is fabricated within the volume surrounded by the Si$_3$N$_4$ spacer 22. This can be achieved by depositing a thin oxide layer (interface SiO$_2$ growth) followed by gate dielectric deposition and the gate metal deposition. For example, the gate dielectric can be formed as a layer 36 of high dielectric constant (high-k) material comprising a dielectric metal oxide and having a dielectric constant that is greater than the dielectric constant of silicon nitride of 7.5. The high-k dielectric layer 36 may be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc. The dielectric metal oxide comprises a metal and oxygen, and optionally nitrogen and/or silicon. Exemplary high-k dielectric materials include HfO$_2$, ZrO$_2$, La$_2$O$_3$, TiO$_2$, SrTiO$_3$, LaAlO$_3$, Y$_2$O$_3$, HfO$_x$N$_y$, ZrO$_x$N$_y$, La$_2$O$_x$N$_y$, Al$_2$O$_x$N$_y$, TiO$_x$N$_y$, SrTiO$_x$N$_y$, LaAlO$_x$N$_y$, Y$_2$O$_x$N$_y$, a silicate thereof, and an alloy thereof. Each value of x is independently from 0.5 to 3 and each value of y is independently from 0 to 2. The thickness of the high-k dielectric layer 36 may be from 1 nm to 10 nm, and more preferably from about 1.5 nm to about 3 nm. The high-k dielectric layer 36 can have an effective oxide thickness (EOT) on the order of, or less than, about 1nm. The gate metal 38 can be deposited directly on the top surface of the high-k dielectric layer 36 by, for example, chemical vapor deposition (CVD), physical vapor deposition (PVD), or atomic layer deposition (ALD). As non-limiting examples the gate metal 38 can include a metal system selected from one or more of TiN, TiC, TaN, TaC, TaSiN, HfN, W, Al and Ru, and is selected at least in part based on the desired work function (WF) of the device (NFET or PFET), as is known.

Subsequent processing, not shown, of the planar PET can include any desired conventional processing including hard mask deposition and the application of S/D and gate contacts.

Described now if the ETSOI embodiment shown in FIG. 2.

Figure 2A:
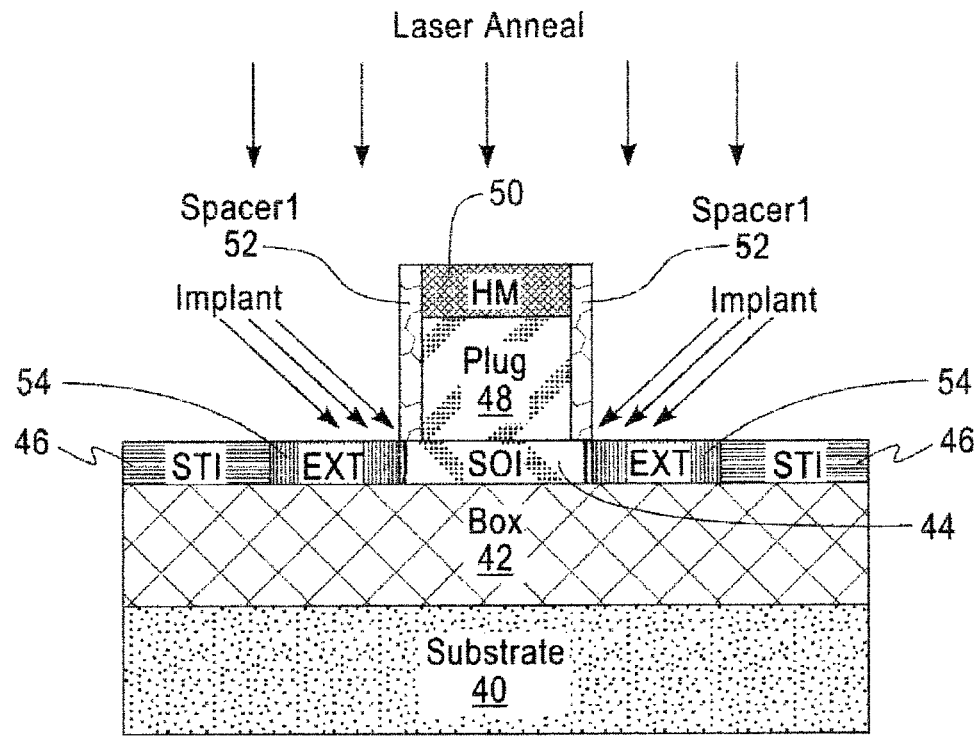
FIGS. 2A-2F, collectively referred to as FIG. 2 describe an ETSOI embodiment of device processing, where.

FIG. 2A shows a cross-sectional enlarged view of a portion of an ETSOI wafer comprised of a substrate, e.g., a Si or any suitable substrate 40. Overlying the substrate 40 is a BOX layer 42 and over the BOX layer 42 a Si (SOI) layer 44. As non-limiting examples the BOX layer 42 can have a thickness in a range of about 20 nm to about 50 nm, and the Si layer 44 can have a thickness in a range of about 4 nm to about 10 nm.

In FIG. 2A the SOI layer 44 has two shallow trench isolation (STI) regions 46 that define an active ETSOI area between the STI regions in which a FET will be fabricated using the replacement gate process. In the active area is formed a structure having a dummy poly plug 48 having an overlying hardmask (HM), such as a SiN HM 50. The plug 48 has approximate dimensions that are desired for the final metal gate stack that will be formed in FIG. 2F. Surrounding the plug 14 and HM 16 in accordance with an aspect of this invention is the first spacer (Spacer1) 52. The Spacer1 52 can be SiO$_2$ and can have a thickness in a range of about 1 nm to about 5 nm, with about 2 nm being one preferred value. As in the embodiment of FIG. 1 the plug 48, the HM 50 and the Spacer1 52 will all be subsequently removed at various stages of the fabrication process.

FIG. 2A further shows a tilted angle extension implant followed by the laser anneal to form extension regions 54 on each side of the dummy gate structure. As in the embodiment of FIG. 1 the thin Spacer1 52 beneficially serves as an implant mask so that there is but a slight overlap of the extension region 54 beneath the outer vertical sidewall of the Spacer1 52. The implanted extension regions 54 are relatively shallow and can extend through the entire depth of the SOI layer 44.

When the transistor being fabricated is an NFET the following conditions can apply:

Extension: implant species Arsenic (As), about 2 KeV implant energy, about $2e^{15}$ (atom/cm$^2$) 10 degree implant angle $\theta$.

When the transistor being fabricated is a PFET the following conditions can apply:

Extension: implant species BF$_2$, about 2 KeV implant energy, about $2e^{15}$ (atom/cm$^2$) 10 degree implant angle $\theta$.

The laser (only) anneal can use a temperature of about 1300° C. for a period of several milliseconds. The laser anneal beneficially forms a sharp, well defined extension junction beneath the outer vertical sidewall of the Spacer1 52 with minimal diffusion of the implanted dopant species.

The implant energy/species can be the same for the ETSOI case as for the bulk case described in FIG. 1. Note that for the ETSOI case the halo implant is not required.

Figure 2B:
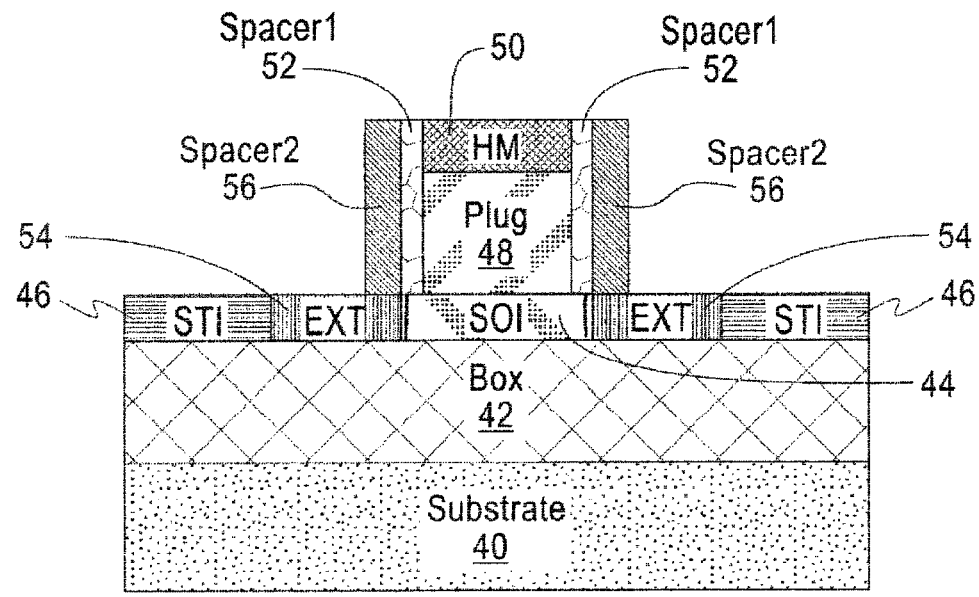

FIG. 2B shows the structure after the angled implant and laser anneal of FIG. 2A, and after the formation of the second spacer (Spacer2 56) that covers SiO$_2$ Spacer1 52. Spacer2 56 can be a Si$_3$N$_4$ spacer and can have a thickness of, for example, about 8 nm. Note that Spacer2 56 will be retained in the final FET device.

Figure 2C:
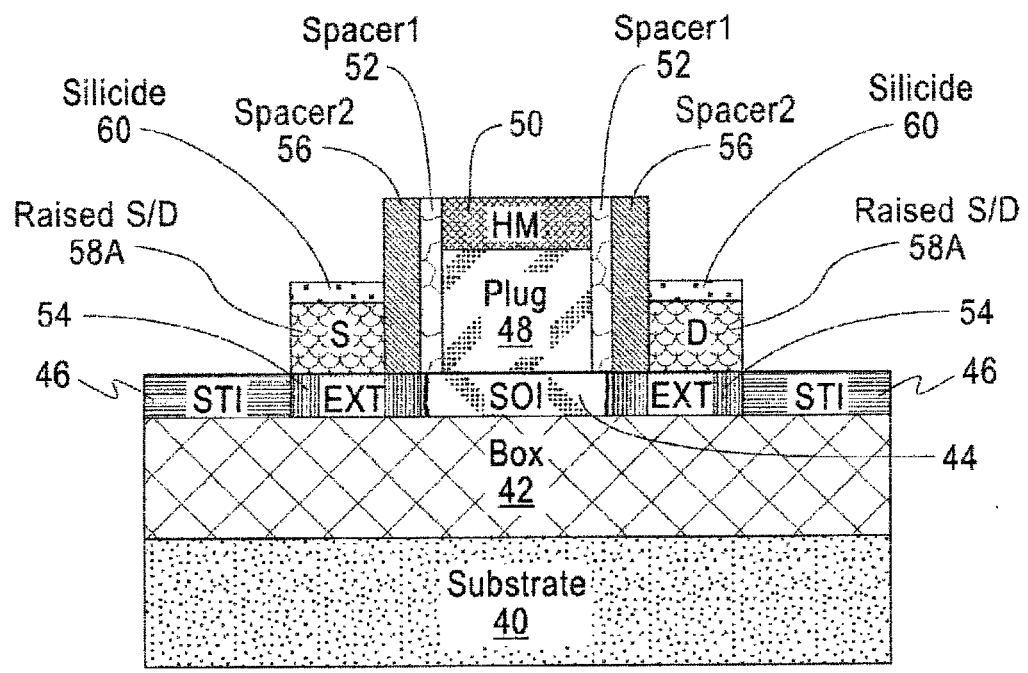

FIG. 2C shows the structure of FIG. 2B after processing to form raised source/drain (RSD) structures 58A, 58B. The RSD structures 58A, 58B are preferably in-situ doped and may have a dopant atom concentration in a range of, for example, about $5 \times 10^{20}$/cm$^3$ to about $8 \times 10^{21}$/cm$^3$. The RSD structures 58A, 58B are formed by the epitaxial growth of silicon, such as by the use of a mixture of silane and dichlorosilane gases with a chemical vapor deposition (CVD) process. Phosphorus is one suitable n-type dopant, and Boron is one suitable p-type dopant.

The formation of in-situ doped RSD structures is well characterized in the art. For example, reference can be made to commonly owned U.S. Pat. No. 6,774,000, "Method of Manufacture of MOSFET Device with In-Situ Doped Raised Source and Drain Structures", Wesley C. Natzle et al., and to "A raised source/drain technology using in-situ P-doped SiGe and B-doped Si for 0.1-µm CMOS ULSIs", Takashi Uchino et al., Electron Devices meeting, 1997, IEDM '97. Technical Digest, International, 7-10 Dec. 1997, pgs. 479-482. Reference can also be made to "Extremely Thin SOI (ETSOI) CMOS with Record Low Variability for Low Power System-on-Chip Applications", K. Cheng, A. Khakifirooz, P. Kulkarni, S. Ponoth, J. Kuss, D. Shahrjerdi, L. F. Edge, A. Kimball, S. Kanakasabapathy, K. Xiu, S. Schmitz, A. Reznicek, T. Adam, H. He, N. Loubet, S. Holmes, S. Mehta, D. Yang, A. Upham, S.-C. Seo, J. L. Herman, R. Johnson, Y. Zhu, P. Jamison, B. S. Haran, Z. Zhu, L. H. Vanamurth, S. Fan, D. Horak, H. Bu, P. J. Oldiges, D. K. Sadana, P. Kozlowski, D. McHerron, J. O'Neill, B. Doris, Solid-State Circuits Conference Digest of Technical Papers (ISSCC), 2010 IEEE International Issue Date: 7-11 Feb. 2010 pgs. 152-153.

FIG. 2C also shows that the in-situ doped RSD structures 58A, 58B have been silicided. For example, Nickel (Ni) can be deposited and heated to form Nickel silicide regions 60 by a conventional process.

Figure 2D:
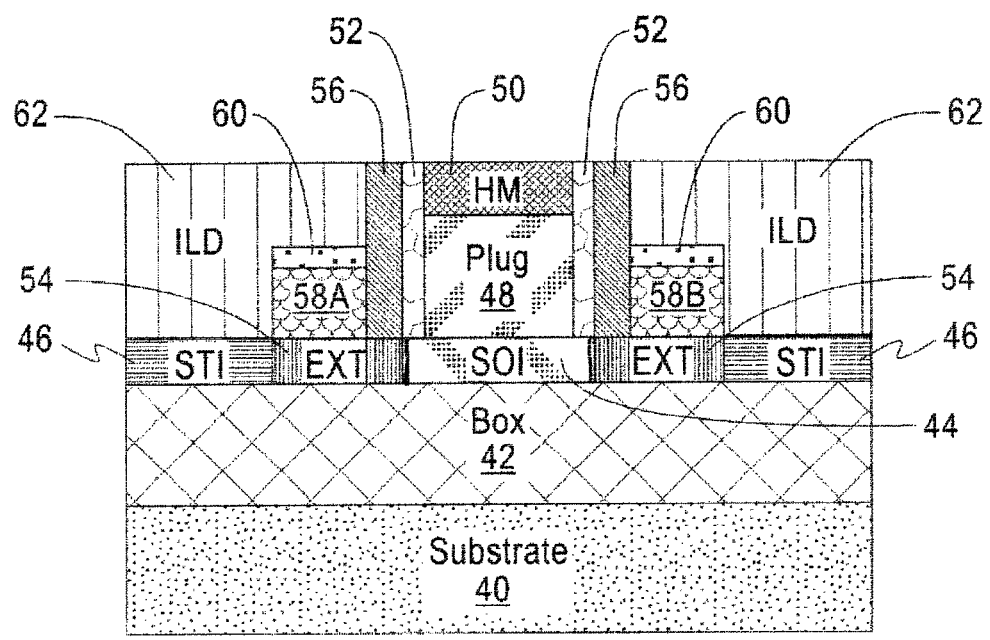

FIG. 2D shows the structure of FIG. 2C after deposition of an inter-layer dielectric (ILD) 62. The ILD 30 can be, for example, $SiO_2$.

Figure 2E:
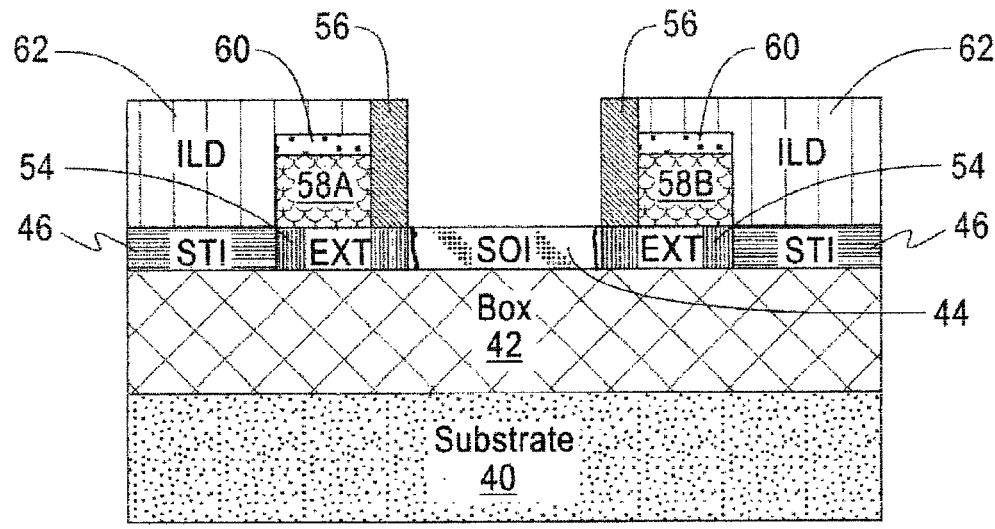

FIG. 2E shows the structure of FIG. 2D after a CMP operation that removes material, including HM 50, down to the top of the plug 48, followed by removal of the plug 48 and removal of the sacrificial thin spacer (Spacer1) $SiO_2$ 52. Removal of the plug 48 and thin spacer 52 can be achieved using any suitable etching process as was discussed above. Removal of the thin spacer 52 results in establishing an optimum overlap of the extension 54 with the gate region due to the angled extension implant performed in FIG. 2A.

Figure 2F:
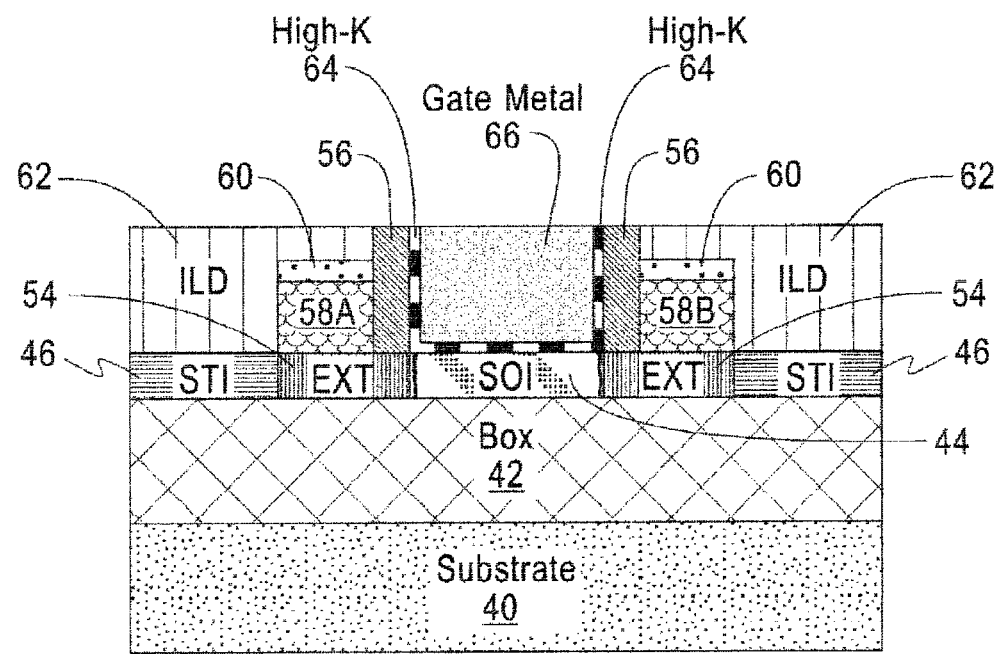

FIG. 2F shows the structure of FIG. 2E after the gate stack is fabricated within the volume surrounded by the $Si_3N_4$ spacer 56. This can be achieved by depositing a thin oxide layer (interface $SiO_2$ growth) followed by gate dielectric deposition and the gate metal deposition. For example, and as in the embodiment of FIG. 1, the gate dielectric can be formed as a layer 64 of high-k and the gate metal 66 can include a metal system selected from one or more of TiN, TiC, TaN, TaC, TaSiN, HfN, W, Al and Ru, and is selected at least in part based on the desired WF of the device (NFET or PFET), as is known.

Subsequent processing, not shown, of the ETSOI FET can include any desired conventional processing including hard mask deposition and the application of S/D and gate contacts.

It is to be understood that although the exemplary embodiments discussed above with reference to FIGS. 1 and 2 are described with regard to certain planar devices and ETSOI devices, respectively, the processes described herein may be used on common variants of the PET device including, e.g., FET devices with multi-fingered FIN and/or gate structures, FET devices of varying gate width and length, as well as ring oscillator devices. Moreover, the transistor device can be connected to metalized pads or other devices by conventional ultra-large-scale integration (ULSI) metallization and lithographic techniques.

It is to be understood that in addition to fabricating transistor device contacts as discussed above, further aspects of the present invention include methods to form contacts for other devices or otherwise constructing integrated circuits with various analog and digital circuitry. In particular, integrated circuit dies can be fabricated with various devices such as a field-effect transistors, bipolar transistors, metal-oxide-semiconductor transistors, diodes, resistors, capacitors, inductors, etc., having contacts that are formed using methods as described herein. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes and etching processes may be used by those skilled in the art. Further, the exemplary embodiments are not intended to be limited to only those materials, metals , insulators, dopants, dopant concentrations, implant energies, layer thicknesses and the like that were specifically disclosed above. Any and all such and similar modifications of the teachings of this invention will still fall within the scope of this invention.

What is claimed is:

1. A method to fabricate a field effect transistor, comprising:

forming on a surface of a semiconductor a dummy gate structure comprised of a plug;

forming a first spacer surrounding the plug, the first spacer being a sacrificial spacer;

after forming the first spacer, performing an angled ion implant to implant a dopant species into the surface of the semiconductor adjacent to an outer sidewall of the first spacer to form a source extension region and a drain extension region, where the dopant species extends under the outer sidewall of the first spacer by an amount that is a function of an angle of the angled ion implant and defines an inner edge of the source extension region and an inner edge of the drain extension region, where each inner edge extends partially but not completely beneath the first spacer;

performing a laser anneal to activate the source extension region and the drain extension region implant;

forming a second spacer surrounding the first spacer after performing the angled ion implant and the laser anneal;

removing the first spacer and the plug to form an opening surrounded by the second spacer, where the inner edge of the source extension region and the inner edge of the drain extension region extend in the semiconductor beyond sidewalls of the opening; and depositing a gate dielectric and gate metal into the opening to form a gate stack.

2. The method of claim 1, where the second spacer is thicker than the first spacer.

3. The method of claim 1, where the angled ion implant is a first angled implant, and further comprising performing a second angled ion implant to form a source extension halo and a drain extension halo.

4. The method of claim 3, where the first angled ion implant is performed at an angle of about 10 degrees measured from a surface normal, and where the second angled ion implant is performed at an angle of about 30 degrees measured from the surface normal.

5. The method of claim 3, where when the FET is an NFET the source and drain extension halo is comprised of a halo implant species of Boron (B), about 5 to about 10 KeV implant energy, about $7\times10^{12}$ to about $7\times10^{13}$ (atom/cm$^2$) with about 10 degrees to about 30 degrees implant tilt angle; and where the dopant species of the source and drain extension regions is Arsenic (As), about 1 to about 3 KeV implant energy, about 1 to about $2\times10^{15}$ (atom/cm$^2$) with about 7 degrees to about 15 degrees implant angle; and when the FET is a PFET the halo implant species is Phosphorus (P), about 15 to about 30 KeV implant energy, about $7\times10^{12}$ to about $2\times10^{13}$ (atom/cm$^2$), about 0 degrees to about 30 degrees implant tilt angle; and where the dopant species of the source and drain extension regions is BF$_2$, about 1 to about 3 KeV implant energy, about 1 to about $2\times10^{15}$ (atom/cm$^2$), about 0 degrees to about 15 degrees implant angle.

6. The method of claim 1, further comprising:
implanting a source and a drain after forming the second spacer;
performing a low temperature anneal; and
performing a laser anneal to activate implanted source and drain dopants.

7. The method of claim 6, further comprising:
performing a punch through stopper (PTS) implant to form a first implanted region between the source and the drain, and
performing a shallow channel implant to form a second implanted region between the source and the drain, where the second implanted region lies between the first implanted region and the surface of the semiconductor.

8. The method of claim 7, where when the FET is an NFET the PTS implant is Boron (B), about 5 to about 15 KeV implant energy, about $7\times10^{12}$ to about $2\times10^{13}$ (atom/cm$^2$), 0 degree implant angle (no tilt), or the PTS implant is Carbon (C), about 3 to about 7 KeV implant energy, about $1\times10^{14}$ to about $1\times10^{15}$ (atom/cm$^2$), 0 degree implant angle (no tilt), and the shallow channel implant is Boron (B), about 5 to about 15 KeV implant energy, about $7\times10^{12}$ to about $2\times10^{13}$ (atom/cm$^2$), 0 degree implant angle (no tilt), or the shallow channel implant is Carbon (C), about 3 to about 7 KeV implant energy, about $1\times10^{14}$ to about $1\times10^{15}$ (atom/cm$^2$), 0 degree implant angle (no tilt); and when the FET is a PFET the PTS implant is Phosphorus (P), about 15 to about 30 KeV implant energy, about $7\times10^{12}$ to about $2\times10^{13}$ (atom/cm$^2$), 0 degree implant angle (no tilt), and the shallow channel implant is Phosphorus (P), about 15 to about 30 KeV implant energy, about $7\times10^{12}$ to about $2\times10^{13}$ (atom/cm$^2$), 0 degree implant angle (no tilt).

9. The method of claim 1, further comprising: forming a raised source-drain structure adjacent to the second spacer.

10. The method of claim 2, where the first spacer has a thickness in a range of about 1 nm to about 5 nm.

11. The method of claim 2, where the first spacer has a thickness of about 2 nm.

* * * * *